(12) United States Patent
Mohan

(10) Patent No.: US 6,714,053 B2
(45) Date of Patent: Mar. 30, 2004

(54) FAST SET RESET LATCH WITH COMPLEMENTARY OUTPUTS HAVING EQUAL DELAY AND DUTY CYCLE

(75) Inventor: Jitendra Mohan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/804,773

(22) Filed: Mar. 13, 2001

(65) Prior Publication Data

US 2003/0164719 A1 Sep. 4, 2003

(51) Int. Cl.[7] .................................................. H03K 5/22
(52) U.S. Cl. ........................ 327/65; 327/217; 327/219
(58) Field of Search ................................. 327/217, 219, 327/208, 198, 170, 225, 263, 264, 266, 210, 55–57, 65, 67, 214, 215, 218, 63, 64; 365/203

(56) References Cited

U.S. PATENT DOCUMENTS 4,717,838 A * 1/1988 Brehmer et al. ............ 327/208
6,060,912 A * 5/2000 Opris et al. .................. 327/57
6,169,533 B1 * 1/2001 Tse ............................ 345/115
6,232,810 B1 * 5/2001 Oklobdzija et al. ......... 327/217

FOREIGN PATENT DOCUMENTS

JP          406177715 A    *   6/1994

* cited by examiner

Primary Examiner—Long Nguyen

(57) ABSTRACT

For use in a strobed comparator circuit of the type comprising a decision circuit and a set-reset (SR) latch for holding an output of the decision circuit, an apparatus and method is disclosed for reducing output delay between two complementary output signals of the SR latch. During the reset phase of the SR latch, only one input to the SR latch changes state while the other input to the SR latch returns to its previous logic state. Information relating to the change of logic states of the decision circuit and of the SR latch is provided to two feed forward transistors that send the information directly to the SR latch output that is likely to have an output signal delay. The apparatus and method of the present invention causes the output signals of the SR latch to arrive at their respective output terminals at approximately the same time.

10 Claims, 6 Drawing Sheets

FAST SET RESET LATCH WITH COMPLEMENTARY OUTPUTS HAVING EQUAL DELAY AND DUTY CYCLE

TECHNICAL FIELD OF THE INVENTION

The present invention is generally directed to compensating for circuit propagation delays in strobed comparators and, more specifically, to compensating for circuit propagation delays in strobed comparators that use regenerative latches.

BACKGROUND OF THE INVENTION

Integrated circuit designs often use strobed comparators to achieve extremely high gains. One limitation of strobed comparators is that the decision circuit outputs of the comparator become invalid once the comparator is in the reset phase. This problem is generally overcome by having a regenerative, or Set-Reset (SR), latch on the output of the decision circuit of the comparator to hold the output value during the reset phase.

Therefore, a strobed comparator now often comprises a decision circuit and an SR latch circuit. The output of the decision circuit is input to the SR latch circuit. The "strobe" signal is also referred to as the "latch" signal. When the latch signal is low, the decision circuit is in reset phase. When the latch signal goes high, the decision circuit makes a decision and outputs the decision to the SR latch. When the latch signal then goes low, the decision circuit is again in reset phase. However, the SR latch holds the value of the decision that the decision circuit made when the latch signal was high. The length of time of the "latch" phase and the length of time of the reset phase are determined by the level of the latch voltage.

SR latches usually have a delay between the first output (Q) changing state and the second complementary output (Qb) changing state. This can give rise to "runt pulses" which are output pulses that do not reach the prescribed voltage level for a logic family's defined state before the pulse retreats.

The delay between outputs can also cause incorrect transients when both outputs of the SR latch are being used in logic operations downstream. For example, in a pipelined analog-digital converter, the delay between the comparator switching and a stage entering hold state must be minimized in order to obtain and maintain increased speed. Furthermore, incorrect transients reduce the hold time even more as the operational amplifier in a residue stage has to overcome the initial incorrect decision. Therefore the propagation delay through the SR latch is the larger of the Q delay or the Qb delay. The analog to digital converter (ADC) must not go into a hold state until after this delay.

Latches that are used today generally have a gate delay between the outputs. One output, output Q, arrives at a certain time but the other output, output Qb, usually arrives later. Alternatively, output Qb arrives first and output Q arrives later. If the comparator is driving a digital to analog converter (DAC), it is important for both outputs to arrive at the same time. Delay for both output scenarios is usually about ten percent (10%) of the delay time of the entire comparator or the latch. Both outputs, Q and Qb, must be active before processing can take place. Because of the output delay inherent in currently available prior art latches, a prior art comparator is approximately ten percent (10%) slower than it would be if there were no output delay.

There is therefore a need in the art for an apparatus that will reduce the delay between outputs in an SR latch circuit in a strobed comparator.

SUMMARY OF THE INVENTION

To address the above-discussed deficiencies of the prior art, it is a primary object of the present invention to provide an apparatus for reducing the delay between outputs in a fast set reset (SR) latch circuit in a strobed comparator.

During the reset phase of the SR latch circuit, only one input to the SR latch circuit changes state while the other input to the SR latch circuit returns to its previous logic state. In the present invention, this information is provided to two transistors that then feed forward the decision circuit state change directly to the SR latch output that is likely to have an output signal delay. By transmitting the input state change to the output of the SR latch that will likely have an output signal delay, the output signals will arrive at the Q output terminal and at the Qb output terminal at the same time.

It is an object of the present invention to provide a fast SR latch that is capable of holding an output from a decision circuit to which the SR latch is coupled.

It is also an object of the present invention to provide a fast SR latch that is capable of determining the logic state of a first output and a second output of a decision circuit to which the SR latch is coupled.

It is an additional object of the present invention to provide a fast SR latch that is capable of sending a logic state of one of either a first output or a second output of a decision circuit to either a first feed forward transistor or a second feed forward transistor.

It is also an object of the present invention to provide a fast SR latch that is capable of utilizing a first feed forward transistor and a second feed forward transistor for controlling a first and second output of an SR latch.

It is also an object of the present invention to provide a fast SR latch that is capable of coordinating the timing of output signals of a strobed comparator.

It is also an object of the present invention to provide a fast SR latch that is capable of eliminating "runt pulses" in logic circuitry coupled to the output of a strobed comparator, where the runt pulses are caused by delays between a first output changing state and a second complementary output changing state.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1A through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged set-reset latch.

Figure 1A:
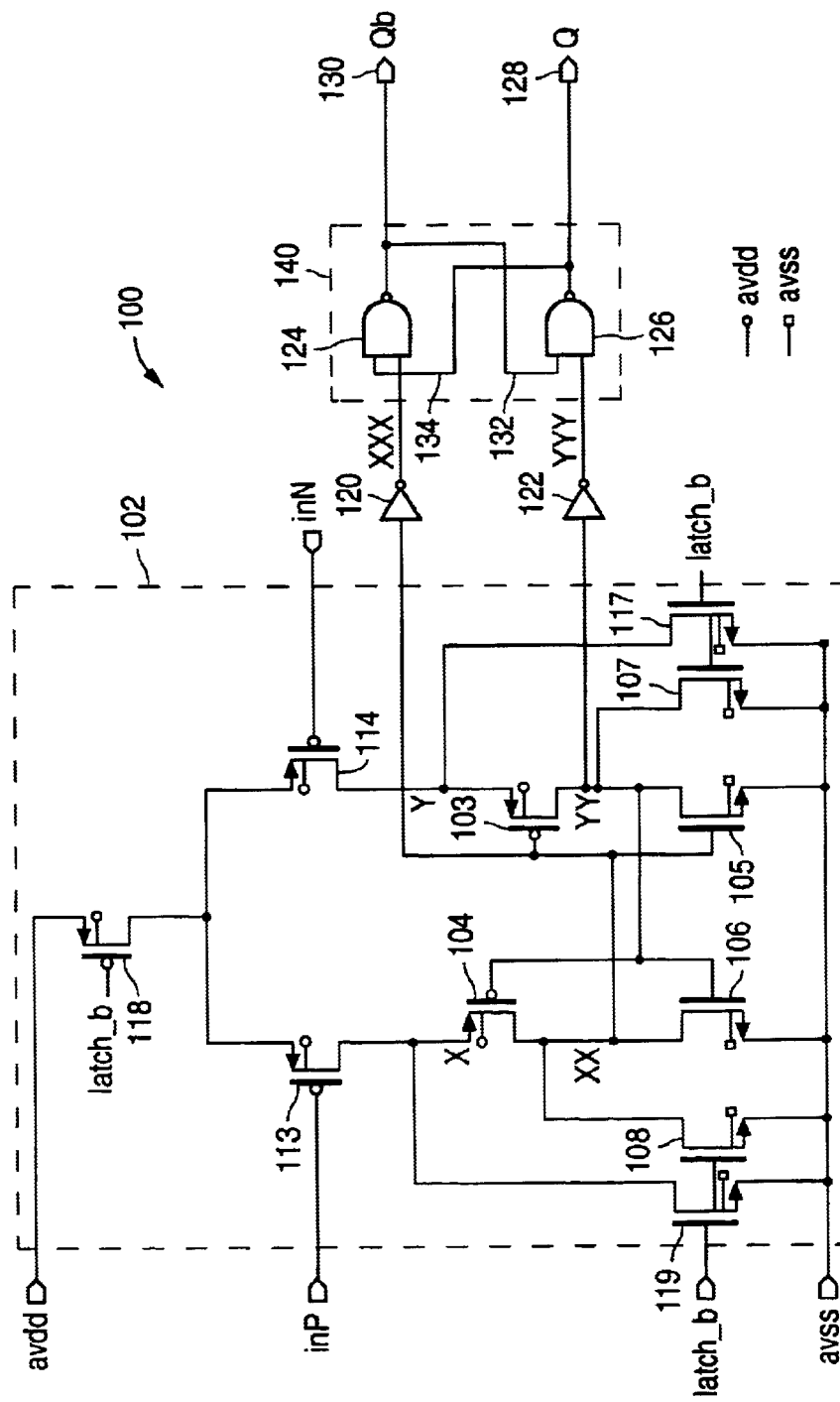
FIG. 1A illustrates an exemplary prior art strobed comparator comprising an exemplary prior art SR latch circuit.

FIG. 1A illustrates a prior art PMOS (P-type metal oxide semiconductor) strobed comparator 100 with a typical prior art SR latch circuit. Comparator 100 comprises decision circuit 102 and SR latch 140. When the latch_b signal is high, decision circuit 102 is in reset phase. When the latch_b signal goes low, decision circuit 102 makes a decision and outputs the decision to SR latch 140. When the latch_b signal then goes high, decision circuit 102 is again in reset phase. However, SR latch 140 holds the value of the decision that decision circuit 102 made when the latch signal was low.

During the reset phase, nodes XX and YY both pull low. Transistor 106 and transistor 104 form a first inverter. Transistor 105 and transistor 103 form a second inverter. The XX node is connected to the input of the second inverter formed by the combination of transistor 105 and transistor 103. The YY node is connected to the input of the first inverter formed by transistor 106 and transistor 104.

Node XX feeds a first output of decision circuit 102 through inverter 120 and NAND gate 124 to output Qb 130. Node YY feeds a second output of decision circuit 102 through inverter 122 and NAND gate 126 to output Q 128.

First inverter formed by transistor 106 and transistor 104 and second inverter formed by transistor 105 and transistor 103 together form a subcircuit. When the latch_b signal on transistor 118 is high, then node XX, node YY, node Y and node X are all pulled low. When certain voltages are on the inputs inP and inN, one side will be stronger than the other side, but there will be no current flow. The word "stronger" refers to a condition in which the "stronger" side experiences more current and lower resistance than the other side. When the latch-b signal on transistor 118 goes low, transistor 119, transistor 108, transistor 107, and transistor 117 are all disconnected and transistor 118 is connected. Based on the value of the input inP on the gate of transistor 113 and on the value of the input inN on the gate of transistor 114, both transistor 113 and transistor 114 are turned on with different strengths.

However, as noted above, the voltage level of one transistor is normally higher than the voltage level of the other transistor. The gate with the highest voltage will pull the corresponding node, either node XX or node YY. Transistor 113 is connected to the first inverter (transistor 104 and transistor 106). Transistor 114 is connected to the second inverter (transistor 103 and transistor 105). As a result, one inverter is slightly stronger than the other inverter. The inverter that is stronger will hold its state. Node XX and node YY both started out low. At the end of the cycle one of the two nodes, either node XX or node YY, will settle back to a low state.

XX signals are sent to inverter 120. YY signals are sent to inverter 122. The output of inverter 120 provides an XXX signal. The output of inverter 122 provides a YYY signal. Both the XXX signal and the YYY signal start high. One of the signals, either the XXX signal or the YYY signal, will transition low. For the signal that transitions low, the output of its associated NAND gate will change. That is, either NAND gate 124 for the XXX signal will change or NAND gate 126 for the YYY signal will change. Assuming that the YYY signal is high, and assuming that the XXX signal is also high, and assuming that the output at Q 128 is "zero," then the output at Qb 130 is "one." Therefore, in this case, if the output of NAND gate 126 is "zero," then the input 132 to NAND gate 126 must be "one."

As the YYY signal changes from a "one" state to a "zero" state, the YYY signal's output Q 128 goes to "one" from "zero." Because NAND gate 126 has one input at "zero" and one input at "one," the output of Q 128 is "one." With the output of Q 128 now at "one," the "one" state now appears at input 134 to NAND gate 124 and causes both inputs to NAND gate 124 to be "one." When both inputs to NAND gate 124 are "one," the output of NAND gate 124 goes from a "one" to a "zero." A delay is introduced between the point at which the Q 128 output goes from low to high and the Qb 130 output goes from high to low. That delay is exactly equal to the delay of NAND gate 124.

Figure 1B:
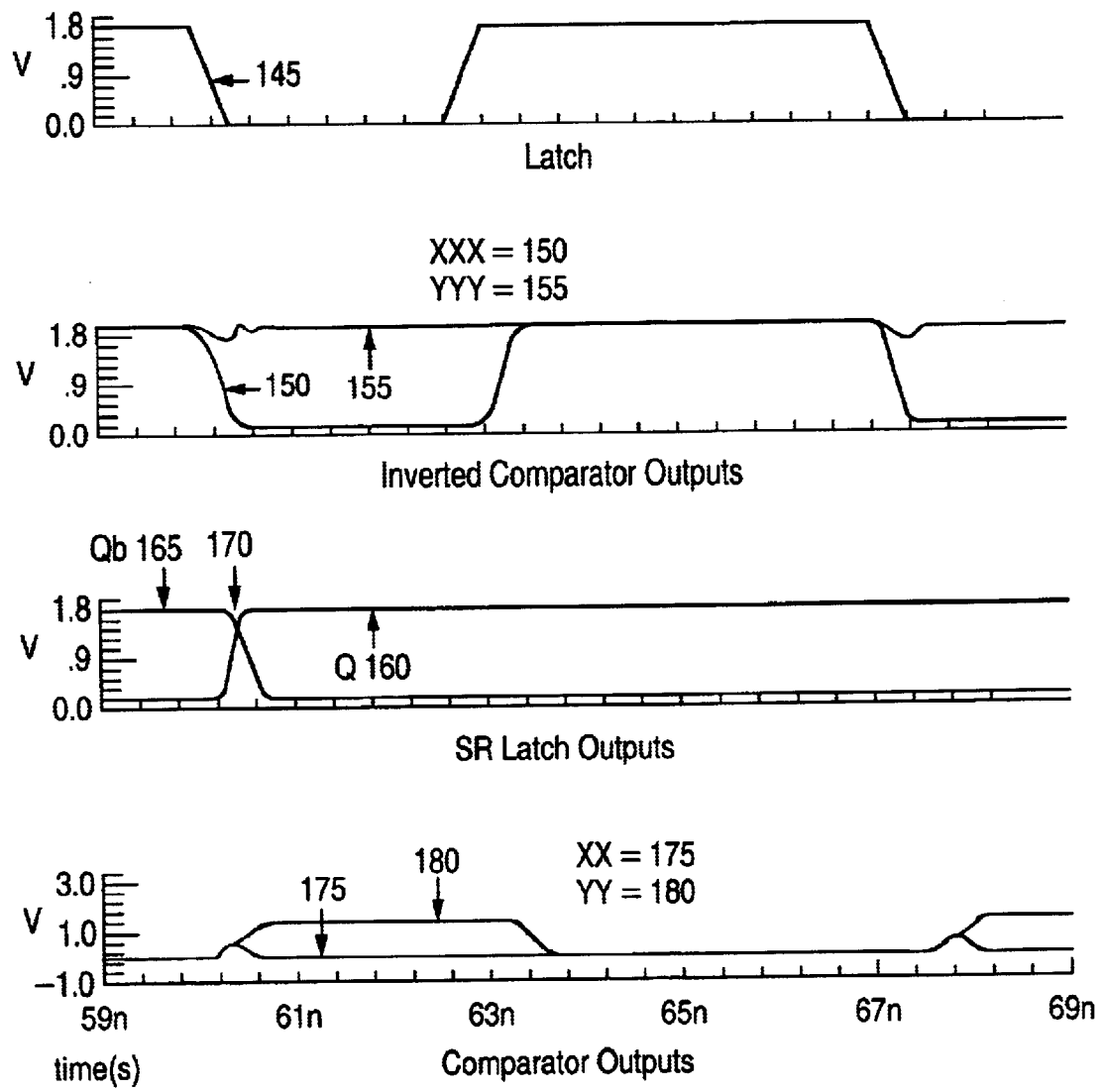
FIG. 1B illustrates waveforms as detected at certain points within the strobed comparator shown in FIG. 1A.

FIG. 1B illustrates waveforms as seen at particular points within comparator 100 shown in FIG. 1A. FIG. 1A should be referred to during the following discussion of the waveforms shown in FIG. 1B. Waveform 145 represents the latch voltage. Waveform 150 graphs inverted comparator signal XXX and waveform 155 graphs inverted comparator signal YYY corresponding to the operation of the latch. Waveform 160 depicts the Q output signal of SR latch circuit 140. Waveform 165 depicts the Qb output signal of SR latch circuit 140. Waveform 175 illustrates the XX output of decision circuit 102. Waveform 180 illustrates the YY output of decision circuit 102.

Q 160 signal rises from a low to a high state when decision circuit 102 makes a decision and Qb 165 goes from a high to a high state. Crossing point 170 is the point that Q 160 and Qb 165 cross, with Q 160 rising from zero volts to Vcc and Qb 165 falling from Vcc to zero volts. Vcc in FIG. 1B is approximately 1.8 volts. Crossing point 170 is an inherent characteristic determined by the magnitude of the signal and the configuration and construction of the SR latch. When crossing point 170 is either high or high with respect to the midpoint between the high state voltage and the high state voltage, there is inefficiency in that Q 160 has to wait for the output of Qb 165 (or Qb 165 has to wait for the output of Q 160), thus delaying further processing. This is commonplace in currently available prior art SR latches. The only time at which efficiency approaches one hundred percent (100%) is when crossing point 170 occurs midway between the high state voltage and the low state voltage. The value of voltage that occurs midway between the high state voltage and the low state voltage in FIG. 1B is approximately half the supply voltage ($V_{cc}$).

Figure 2:
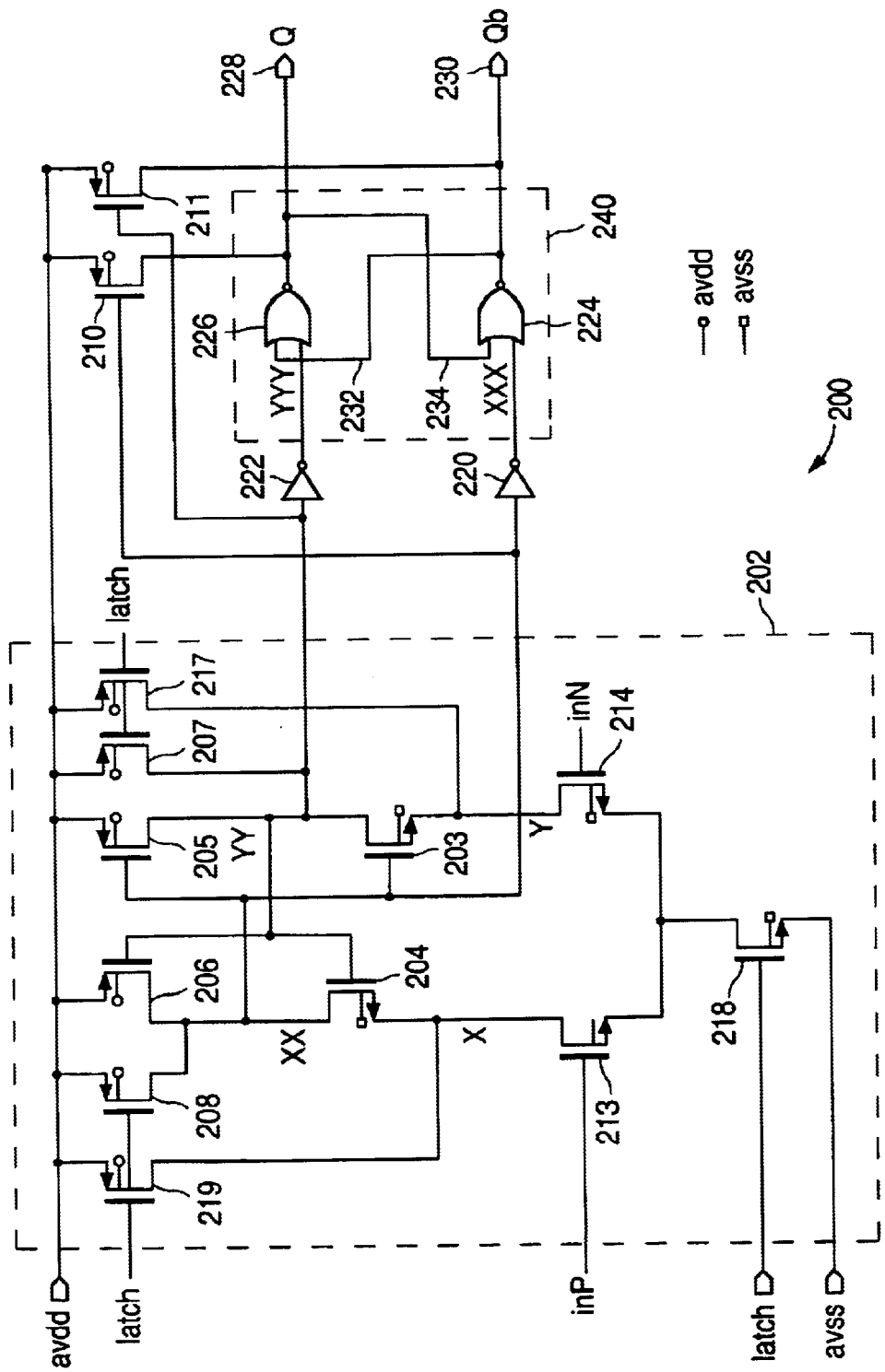
FIG. 2 illustrates an exemplary strobed comparator circuit for reducing output delay in an SR latch according to an advantageous embodiment of the present invention.

FIG. 2 illustrates an exemplary strobed comparator circuit 200 for reducing output delay in an SR latch according to one embodiment of the present invention. FIG. 2 illustrates a NMOS (N-type metal oxide semiconductor) strobed comparator 200 comprising decision circuit 202 and SR latch 240. When the latch signal is low, decision circuit 202 is in reset phase. When the latch signal goes high, decision circuit 202 makes a decision and outputs the decision to SR latch 240. When the latch signal then goes low, decision circuit 202 is again in reset phase. However, SR latch 240 holds the value of the decision that decision circuit 202 made when the latch signal was high. As will be more fully described below, comparator 200 also comprises feed forward transistor 210 and feed forward transistor 211 for reducing the output delay in SR latch 240.

During the reset phase, nodes XX and YY both pull high. Transistor 206 and transistor 204 form a first inverter. Transistor 205 and transistor 203 form a second inverter. The XX node is connected to the input of the second inverter formed by the combination of transistor 205 and transistor 203. The YY node is connected to the input of the first inverter formed by transistor 206 and transistor 204.

Node XX feeds a first output of decision circuit 202 through inverter 220 and NOR gate 224 to output Qb 230. Node YY feeds a second output of decision circuit 202 through inverter 222 and NOR gate 226 to output Q 228.

First inverter formed by transistor 206 and transistor 204 and second inverter formed by transistor 205 and transistor 203 together form a subcircuit. When the latch signal on transistor 218 is low, then node XX, node YY, node Y and node X are all pulled high. When certain voltages are on the inputs inP and inN, one side will be stronger than the other side, but there will be no current flow. The word "stronger" refers to a condition in which the "stronger" side experiences more current and lower resistance than the other side. When the latch signal on transistor 218 goes high, transistor 219, transistor 208, transistor 207, and transistor 217 are all disconnected and transistor 218 is connected. Based on the value of the input inP on the gate of transistor 213 and on the value of the input inN on the gate of transistor 214, both transistor 213 and transistor 214 are turned on with different strengths.

However, as noted above, the voltage level of one transistor is normally higher than the voltage level of the other transistor. The gate with the highest voltage will pull the corresponding node, either node XX or node YY. Transistor 213 is connected to the first inverter (transistor 204 and transistor 206). Transistor 214 is connected to the second inverter (transistor 203 and transistor 205). As a result, one inverter is slightly stronger than the other inverter. The inverter that is stronger will hold its state. Node XX and node YY both started out high. At the end of the cycle one of the two nodes, either node XX or node YY, will settle to a low state.

XX signals are sent to inverter 220. YY signals are sent to inverter 222. The output of inverter 220 provides an XXX signal. The output of inverter 222 provides a YYY signal. Both the XXX signal and the YYY signal start low. One of the signals, either the XXX signal or the YYY signal, will transition high. For the signal that transitions high, the output of its associated NOR gate will change. That is, either NOR gate 224 for the XXX signal will change or NOR gate 226 for the YYY signal will change. Assuming that the YYY signal is low, and assuming that the XXX signal is also low, and assuming that the output at Q 228 is "one," then the output at Qb 230 is "zero." Therefore, if the output of NOR gate 226 is "one," then the input 232 to NOR gate 226 must be "zero."

As the YYY signal changes from a "zero" state to a "one" state, the YYY signal's output Q 228 returns to "zero" from "zero." Because NOR gate 226 has one input at "zero" and one input at "one," the output of Q 228 is "zero." With the output of Q 228 now at "zero," the "zero" state now appears at input 234 NOR gate 224 and causes both inputs to NOR gate 224 to be "zero." When both inputs to NOR gate 224 are "zero," the output of NOR gate 224 goes from a "zero" to a "one." A delay is introduced between the point at which the Q 228 output goes from high to low and the Qb 230 output goes from low to high. That delay is exactly equal to the delay of NOR gate 224.

Feed forward transistor 210 and feed forward transistor 211 are used to reduce the output delay in SR latch 224. Feed forward transistor 210 is connected to node XX. Feed forward transistor 211 is connected to node YY. Node XX and node YY both start out high, and then one of the nodes—in this case, node YY—goes from a "one" to a "zero." Node YY is connected to the gate of transistor 211 and as soon as node YY falls from a "one" to a "zero," transistor 211 turns on. At this point transistor 211 is attempting to raise Qb 230 prior to the input data propagating through transistor 214, through the second inverter formed by transistor 203 and transistor 205, and through NOR gate 226. As soon as the level at node YY changes, transistor 211 starts pulling up on Qb 230. By properly sizing transistor 210 and transistor 211, the output waveforms, Q 228 and Qb 230, cross at the midpoint between high state and low state.

The first half of comparator 200 always has the state in which the outputs are both "ones" in this implementation. Only one of the outputs will fall back to "zero." Qb 230 is adjusted to achieve a symmetrical crossing of Q 228 and Qb 230 which provides for an output signal appearing at Q 228 and at Qb 230 at the same time. This arrangement allows processing to start sooner than processing would start in a prior art SR latch.

Figure 3:
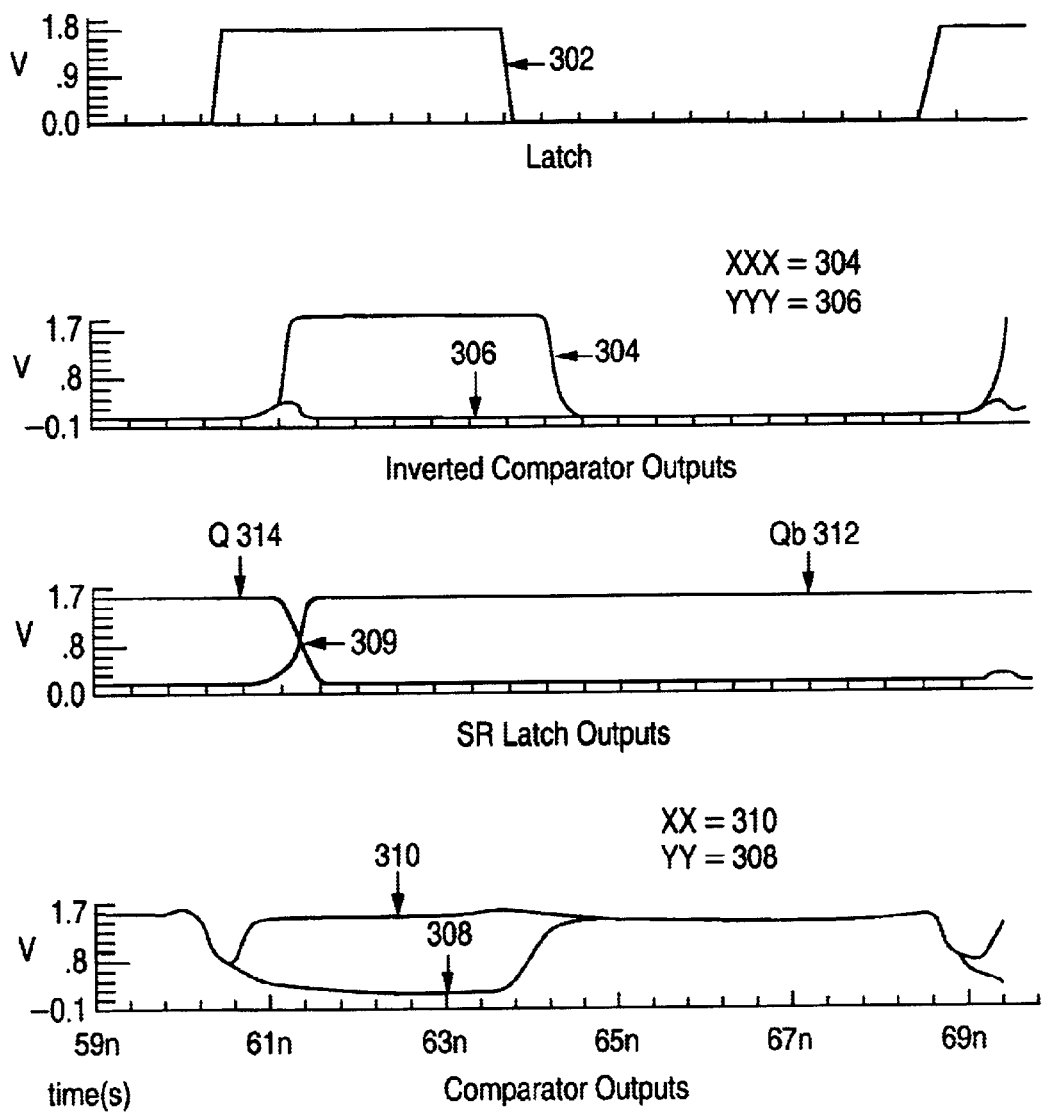
FIG. 3 illustrates a set of waveform diagrams as detected at certain points in the strobed comparator shown in FIG. 2.

FIG. 3 illustrates voltage waveforms as seen at particular points within comparator 200 shown in FIG. 2. FIG. 2 should be referred to during the following discussion of the waveforms shown in FIG. 3. The circuit depicted in FIG. 2 is an NMOS (N-type channel metal oxide semiconductor) circuit. When latch signal 302 goes high in decision circuit 202, then decision circuit 202 is triggered, and the outputs at node XX and at node YY change. Feed forward transistor 210 is triggered by the output at node XX of decision circuit 202. Feed forward transistor 211 is triggered by the output at node YY of decision circuit 202. When latch signal 302 is low, then XXX signal 304 and YYY signal 306 start out low. Then one signal—in this case, XXX signal 304—goes high and YYY signal 306 returns to its regular low value. As soon as the latch reaches the "on" state, XXX signal 304 and YYY signal 306 both start to rise. Depending on which input was stronger, inP or inN (see FIG. 2), one of the outputs continues rising up to $V_{cc}$ and the other output falls back to its default state. XXX signal 304 is an inverted version of XX signal 310. YYY signal 306 is an inverted version of YY signal 308.

XX signal 310 and YY signal 308 also feed forward directly to the outputs Qb 312 and Q 314, respectively. Qb 312 starts its transition before Q 314 starts its transition. As a result of the different start times due to feed forward transistors, 210 and 211, Qb 312 and Q 314 cross at midpoint 309 between the high state and the low state.

Referring to the prior art waveforms shown in FIG. 1B, in prior art comparator 100, without the feed forward transistors of the present invention, the latch still comes to the falling edge of latch signal 145. Both the XXX node and the YYY node, as a result of the XX signal and the YY signal, change their states. In prior art comparator 100, Q rises first and Qb starts a gate delay after Q starts. As a result of the different starting times, with an imposed gate delay, the signals are crossing at a point 170 that is closer to the high state rather than crossing in the middle. The feed forward transistor arrangement of the present invention causes the output signals to cross at midpoint 309 which confirms that the outputs are changing their state at or near the same time, thereby improving efficiency and increasing the speed of the SR latch.

Figure 4:
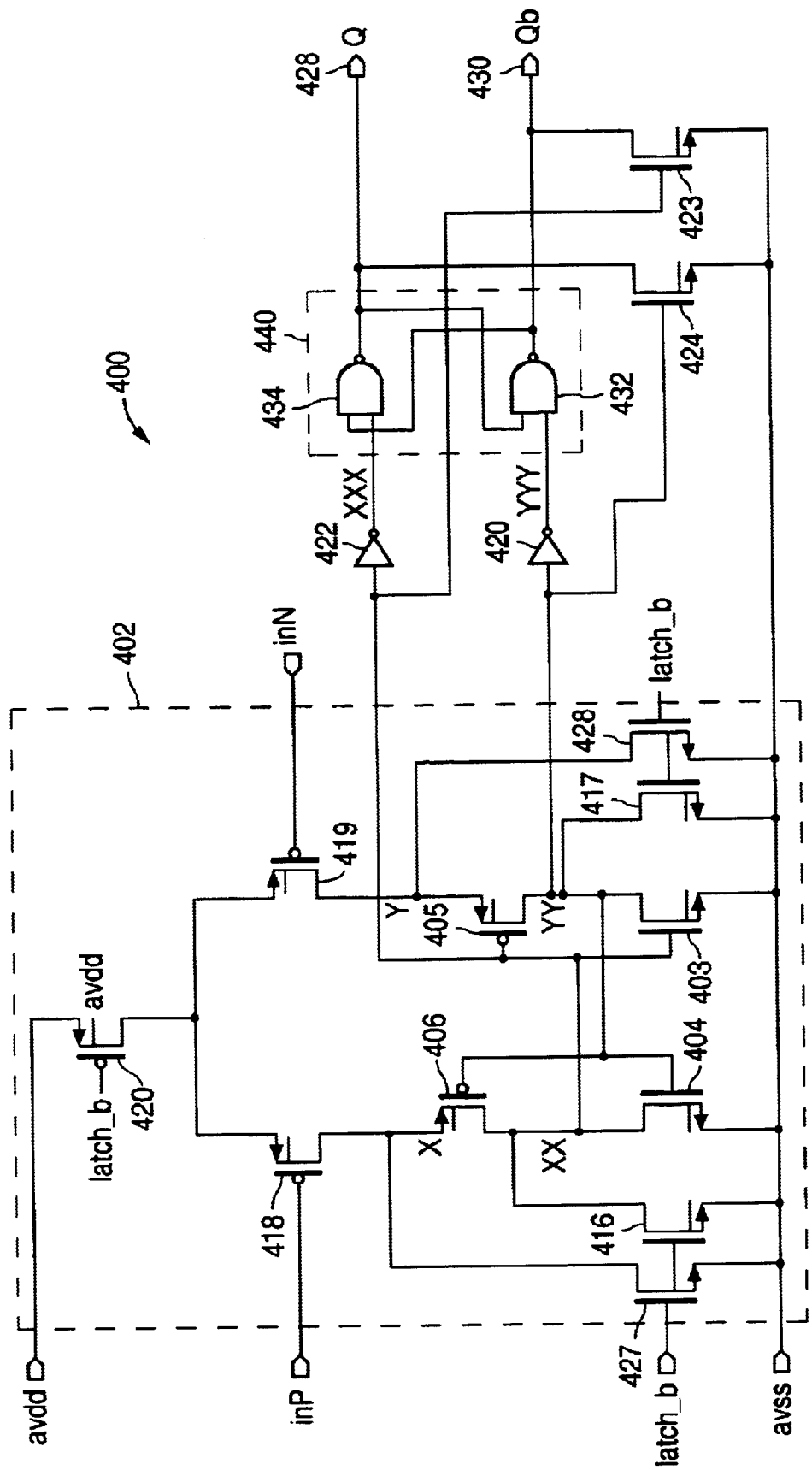
FIG. 4 illustrates an exemplary strobed comparator circuit for reducing output delay in an SR latch according to another advantageous embodiment of the present invention.

FIG. 4 illustrates an exemplary circuit 400 for reducing output delay in an SR latch according to another advantageous embodiment of the present invention. Circuit 400 is similar in operation to the NMOS circuit shown in FIG. 2. Circuit 400, however, is a PMOS (P-type channel metal oxide semiconductor) circuit as opposed to the NMOS circuit shown in FIG. 2. In addition, feed forward transistor 423 and feed forward transistor 424 are both n-type transistors. In SR latch 440 NAND gates (432, 434) are used instead of the NOR gates (224, 226) that are used in SR latch 240. In decision circuit 402 node XX and node YY start low. In decision circuit 402 node XXX and node YYY start high instead of starting low as they do in decision circuit 202. The operation of comparator 400 is generally the same as the operation of comparator 200. Comparator 200 and comparator 400 both have the same output and the same timing.

Figure 5:
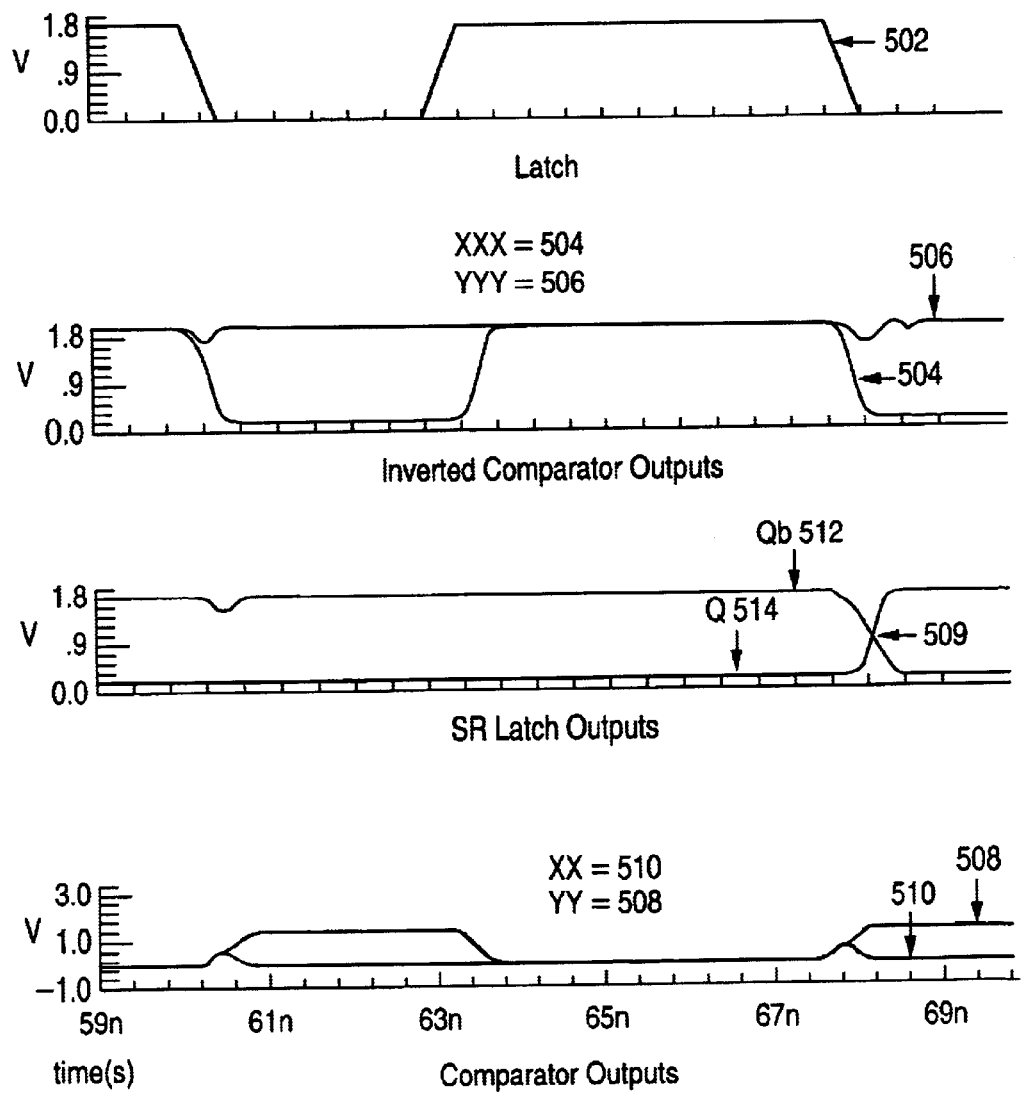
FIG. 5 illustrates a set of waveform diagrams as detected at certain points in the strobed comparator shown in FIG. 4.

FIG. 5 illustrates voltage waveforms as seen at particular points within comparator 400 shown in FIG. 4. FIG. 4 should be referred to during the following discussion of the waveforms shown in FIG. 5. The circuit depicted in FIG. 4 is a PMOS (P-type channel metal oxide semiconductor) circuit. When latch signal 502 goes low in decision circuit 402, then feed forward transistor 423 and feed forward transistor 424 are triggered by the rising edge of signal XX or signal YY. When latch signal 502 is high, the XXX signal 504 and the YYY signal 506 start out high. When latch signal 502 goes low, then one signal—in this case, the XXX signal 504—goes low and the YYY signal 506 remains at its regular value. As soon as latch signal 502 goes low, the YY signal 508 and the XX signal 510 both start to rise. Depending on which input was stronger, inP or inN (see FIG. 4), one of the outputs continues rising up to $V_{cc}$ and the other output falls back to its default state. XXX signal 504 is an inverted version of XX signal 508. YYY signal 506 is an inverted version of YY signal 510.

XX signal 508 and YY signal 510 also feed forward directly to the outputs Qb 512 and Q 514, respectively. Qb 512 starts its transition before Q 514 starts its transition. As a result of the different start times, Qb 512 and Q 514 cross at midpoint 509 between the high state and the low state.

In prior art comparator 100, Q rises first and Qb starts a gate delay after Q starts. As a result of the different starting times, with an imposed gate delay, the signals are crossing at a point that is closer to the high state rather than crossing in the middle. The feed forward transistor arrangement of the present invention causes the output signals to cross at midpoint 309 (or midpoint 509) which confirms that the outputs are changing their state at or near the same time, thereby improving efficiency and increasing the speed of the SR latch.

In summary, two feed forward transistors are utilized to provide a signal to the outputs of the SR latch of a comparator during the decision phase. The comparator may be either a PMOS comparator or an NMOS comparator. The output of the decision circuit is fed forward directly to the SR latch output that is likely to require an extra delay. The forwarded signal reduces the total delay on that particular output and results in equal delays from latch signal to Q and Qb outputs. Both outputs have an equal delay resulting in improved duty cycle and shorter propagation delays.

Although the present invention has been described in detail, those skilled in the art should understand that they can make various changes, substitutions and alterations herein without departing from the spirit and scope of the invention in its broadest form.

What is claimed is:

1. A strobed comparator circuit comprising:

a latched decision circuit for receiving a first input signal and a second input signal and outputting a first output signal and a second output signal, wherein said first and second output signals are both high when said latched decision circuit is not latched, and wherein said first output goes from high to low if said first input is higher than said second input when a latch signal is received and said second output goes from high to low if said second input higher than said first input when said latch signal is received;

a set-reset latch having a first input for receiving said first cutout of said latched decision circuit and a second input for receiving said second output of said latched decision circuit and wherein said set-reset latch has a first output and a second output; and a first transistor having an input terminal connected to said first output of said latched decision circuit and an output terminal connected to said second output of said set-reset latch, wherein said first transistor is a pull-up transistor for pulling said second output of said set-reset latch to a high signal level when said first output of said latched decision circuit goes from high to low.

2. The strobed comparator circuit as set forth in claim 1 wherein said first transistor is a P-channel transistor having a gate connected to said first output of said latched decision circuit and a drain coupled to said second output of said set-reset latch.

3. The strobed comparator circuit as set forth in claim 1 further comprising a second transistor having an input terminal connected to said second output of said latched decision circuit and au output terminal connected to said first output of said set-reset latch.

4. The strobed comparator circuit as set forth in claim 3 wherein said second transistor is a pull-up transistor for pulling said first output of said set-reset latch to the high signal level when said second output of said latched decision circuit goes from high to low.

5. The strobed comparator circuit as set forth in claim 4 wherein said second transistor is a P-channel transistor having a gate connected to said second output of said latched decision circuit and a drain coupled to said first output of said set-reset latch.

6. A strobed comparator circuit comprising:
   a latched decision circuit for receiving a first input signal and a second input signal and outputting a first output signal and a second output signal, wherin said first and second output signals are both low when said latched decision circuit is not latched, and wherein said first output goes from low to high if said first input is higher than said second input when a latch signal is received and said second output goes from low to high if said second input is higher than said first input when said latch signal is received;
   a set-reset latch having a first input for receiving said first output of said latched decision circuit and a second input for receiving said second output of said latched decision circuit and wherein said set-reset latch has a first output and a second output; and
   a first transistor having an input terminal connected to said first output of said latched decision circuit and an output terminal connected to said second output of said set-reset larch, wherein said first transistor is a pull-down transistor for pulling said second output of said set-reset latch to a low signal level when said first output of said latched decision circuit goes from low to high.

7. The strobed comparator circuit as set forth in claim 6 wherein said first transisor is an N-channel transistor having a gate connected to said first output of said latched decision circuit and a drain coupled to said second output of said set-reset latch.

8. The strobed comparator circuit as set forth in claim 6 further comprising a second transistor having an input terminal connected to said second output of said latched decision circuit and an output terminal connected to said first output of said set-reset latch.

9. The strobed comparator circuit as set forth in claim 8 wherein said second transistor is a pull-down transistor for pulling said first output of said set-reset latch to the low signal level when said second output of said latched decision circuit goes from low to high.

10. The strobed comparator circuit as set forth in claim 9 wherein said second transistor is an N-channel transistor having a gate connected to said second output of said latched decision circuit and a drain coupled to said first output of said set-reset latch.

* * * * *

UNITED STATES PATENT AND TRADEMARK OFFICE
CERTIFICATE OF CORRECTION

PATENT NO. : 6,714,053 B2
DATED : March 30, 2004
INVENTOR(S) : Jitendra Mohan

It is certified that error appears in the above-identified patent and that said Letters Patent is hereby corrected as shown below:

Column 6,
Line 26, insert -- to -- after "234";

Column 8,
Line 45, delete "cutout" and insert -- output --;

Column 10,
Line 1, delete "larch" and insert -- latch --.

Signed and Sealed this

Fourth Day of April, 2006

JON W. DUDAS
*Director of the United States Patent and Trademark Office*